United States Patent
Chester

[11] Patent Number: 5,959,501
[45] Date of Patent: Sep. 28, 1999

[54] CLASS D AMPLIFIER WITH SCALED CLOCK AND RELATED METHODS

[75] Inventor: David B. Chester, Palm Bay, Fla.

[73] Assignee: Harris Corporation, Palm Bay, Fla.

[21] Appl. No.: 09/007,326

[22] Filed: Jan. 14, 1998

[51] Int. Cl.⁶ ............................ H03F 3/217; H03F 21/00; H03M 5/08; H03K 7/08
[52] U.S. Cl. ........................... 330/251; 341/53; 381/120; 375/238
[58] Field of Search ................................ 330/207 A, 251, 330/10; 341/53; 381/116, 117, 111, 120; 375/238, 241, 242

[56] References Cited

U.S. PATENT DOCUMENTS

| | | | |
|---|---|---|---|
| 4,673,887 | 6/1987 | Atherton . | |
| 4,673,888 | 6/1987 | Atherton | 330/10 |
| 5,008,675 | 4/1991 | Toyomaki | 341/152 |
| 5,103,462 | 4/1992 | Elle et al. | 341/155 |
| 5,311,548 | 5/1994 | Nikolaus | 375/22 |

*Primary Examiner*—Robert Pascal
*Assistant Examiner*—Patricia Nguyen
*Attorney, Agent, or Firm*—Allen, Dyer, Doppelt, Milbrath & Gilchrist, P.A.

[57] ABSTRACT

A class D amplifier includes a scaled clock generator for generating a scaled clock signal based upon an N bit pulse code modulation (PCM) signal and a K most significant bits (MSBs) PCM signal from the N bit PCM signal; and a PCM to pulse width modulation (PWM) converter for converting the K MSBs signal to a PWM output signal based upon the scaled clock signal. The amplifier preferably includes an input circuit for generating the N bit PCM signal from an input signal, and a truncation circuit for truncating the N bit PCM digital signal to the K MSBs PCM signal. The PWM output signal may be coupled to a switch driver which, in turn, is coupled to one or more output switches. The amplifier uses a practically implemented reference clock without the drawbacks associated with a conventional noise shaping filter. The scaled clock generator may be provided by a divider having a first input receiving the N bit digital input signal and a second input receiving the K MSBs signal for generating a clock scale ratio signal. The scaled clock generator may also include a reference clock, and a numerically controlled clock connected thereto for producing the scaled clock signal. The scaled clock generator may further include a bias circuit for inputting a bias value to the divider so that a numerator thereof is greater than zero.

34 Claims, 3 Drawing Sheets

CLASS D AMPLIFIER WITH SCALED CLOCK AND RELATED METHODS

FIELD OF THE INVENTION

The invention relates to the field of electronic circuits and devices, and, more particularly, to a class D amplifier and related methods.

BACKGROUND OF THE INVENTION

Amplifiers are widely used in many electronic devices to increase the input signal level to a desired output level. A class D amplifier includes an active device used as an on-off switch, and output power variations are achieved by pulse-width modulation. Class D amplifiers may be used in radio broadcast transmitters, and audio amplifiers, for example. The very high switching efficiency of power metal-oxide field-effect transistors (MOSFETs), for example, permits their use in class D audio amplifiers to produce high fidelity signals with relatively compact and efficient circuits.

A typical digital input class D amplifier 10 is shown in FIG. 1. The amplifier 10 includes a digital format converter 11 which receives the input signal in a standard format. A sample rate converter 12 converts the output of the digital format converter for input to the pulse code modulation (PCM) to pulse width modulation (PWM) converter 13. The output of the PCM to PWM converter 13 is coupled to the illustrated level shifter 14, bridge 15, and ultimately to a transducer 16, such as a loudspeaker, for example. Reference number 17 illustrates various possible feedback paths for the amplifier 10.

Unfortunately, a significant difficulty occurs in converting the high resolution PCM signal to a corresponding high resolution PWM signal. This is so because as the width of a pulse increases, it's direct current (dc) content increases with a one-to-one relationship. Each individual pulse has a sinc (x) frequency response. If the pulse repetition rate is high enough, then the low pass filter essentially only 15 passes the dc component of each pulse and smooths the transition from one dc level to another as the dc values change as a function of time. Because this system is a sampled time system, the pulse widths are quantized in time as shown in the graphical plots of FIG. 2, where P1–P5 are the illustrated pulses, and the upper plot 18 illustrates the pulse resolution clock edges. This PWM width quantization translates directly into a dc amplitude quantization. There is a practical limitation on the pulse resolution clock 18, the clock that defines the pulse width quantization. This places an inherent limitation on the pulse width resolution which, in turn, limits the total harmonic distortion (THD) of the output signal.

For example, assuming a pulse repetition of 350 KHz, this repetition rate is high enough to support the operating assumption that the low pass filter at the amplifier's output is passing only the near dc signal component, while not being so high as to force a prohibitively high pulse resolution clock for lower resolutions. Higher resolutions are quite different. For example, if it is desired to preserve 16 bits of accuracy through the PCM to PWM conversion, then the pulse repetition clock rate required is 350 KHz times $2^{16}$ or 23 GHz. Such a high required clock rate is impractical.

One prior art approach to overcome this difficulty is to add a noise shaper or filter 21 to the processing chain upstream of the PCM to PWM converter 13 in the circuit 20 as shown in FIG. 3. The noise shaper 21 reduces the required resolution of the PCM signal, and, thus reduces the required time resolution of the subsequent PWM signal. The noise shaper 21 does this by weighting the quantization noise toward the ultimately rejected higher frequencies, and uses the high frequency noise to dither the signal of interest through the low resolution PCM to PWM converter 13. The input signal has an N bit resolution and the output signal has an M bit resolution, where N is greater than M. The ability of the noise shaper 21 to shape the noise is based upon the fact that adjacent input samples are highly correlated. This correlation is assured by the preceding interpolation in the sample rate conversion block 12.

The output signal-to-noise ratio (SNR) can be increased by increasing the degree of oversampling of the input signal, or increasing the order of the noise shaping filter 21. Unfortunately, increasing the degree of oversampling drastically increases overall system complexity, while increasing the noise shaping filter's order beyond three offers diminishing improvement in performance at reasonable oversampling rates. One source of increased system complexity occurs because interpolation filter complexity must be increased.

Another difficulty arises because increasing he oversampling increases the PWM repetition rate. Thus, to keep the same pulse resolution clock rate, one less bit is allowed in the quantizer for every factor of two that the sampling rate is increased. This may mean that for a third order noise shaping filter, a net noise floor gain of approximately 1.6 bits is realized for every factor of two that the sampling rate is increased, and assuming ideal interpolation.

Yet another difficulty with a conventional noise shaping filter 21 is based upon the dithering 10 noise that must be carried through the PCM to PWM converter 13 to decrease the required PWM timer resolution. This dithering may be later removed by the low pass filter 22. However, there may be perceptible effects in sound quality that result from the dithering.

SUMMARY OF THE INVENTION

In view of the foregoing background, it is therefore an object of the present invention to provide a class D amplifier and associated methods having reduced or eliminated requirements for a noise shaping circuit.

This and other objects, features and advantages in accordance with the present invention are provided by a class D amplifier comprising a scaled clock generator for generating a scaled clock signal based upon an N bit pulse code modulation (PCM) signal and a K most significant bits (MSBs) PCM signal from the N bit PCM signal, and a PCM to pulse width modulation (PWM) converter for converting the K MSBs signal to a PWM output signal based upon the scaled clock signal. More particularly, the amplifier preferably includes input means for generating the N bit PCM signal from an input signal, and truncation means for truncating the N bit PCM digital signal to the K MSBs PCM signal. The PWM output signal may be coupled to a switch driver which, in turn, is coupled to one or more output switches. Accordingly, a high quality output signal is produced with a practically implemented reference clock, and without the complexity and/or fidelity drawbacks associated with a class D amplifier including a conventional noise shaping filter.

The scaled clock generator or generating means may be provided by a divider having a first input receiving the N bit digital input signal and a second input receiving the K MSBs signal for generating a clock scale ratio signal. In one embodiment, the first input of the divider is a denominator input and the second input is a numerator input. The scaled clock generating means may also include a reference clock, and a numerically controlled clock having a first input connected to the reference clock and a second input connected to receive the clock scale ratio signal for producing the scaled clock signal.

According to another aspect of the invention, the scaled clock generator may further comprise bias means for inputting a bias value to the divider so that a numerator thereof is greater than zero. In addition, the amplifier may also include bias subtracting means for subtracting the bias downstream from the PCM to PWM converter.

Of course, the PCM to PWM converter may be one of a leading edge, trailing edge, and symmetric PCM to PWM converter. Additionally, the PCM to PWM converter may be a binary or trinary polarity PCM to PWM converter.

A method aspect of the invention is for performing class D amplification. The method preferably comprises the steps of: generating a scaled clock signal based upon an N bit pulse code modulation (PCM) signal and a K most significant bits (MSBs) PCM signal from the N bit PCM signal; and converting the K MSBs signal to a pulse width modulation (PWM) output signal based upon the scaled clock signal. The step of generating the scaled clock signal may preferably comprise the steps of: dividing the K MSBs signal by the N bit digital input signal for generating a clock scale ratio signal, and controlling a numerically controlled clock by the clock scale ratio signal for producing the scaled clock signal.

The method may also include the steps of: inputting a bias value for the dividing step so that a numerator is greater than zero, and subtracting the bias downstream from the PCM to PWM converting.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
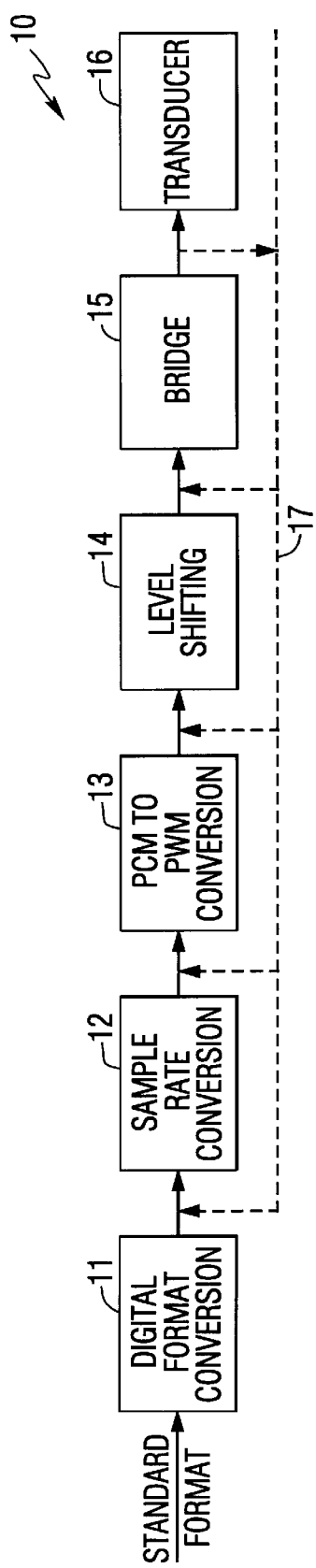
FIG. 1 is a schematic block diagram of a class D amplifier according to the prior art.
Figure 2:
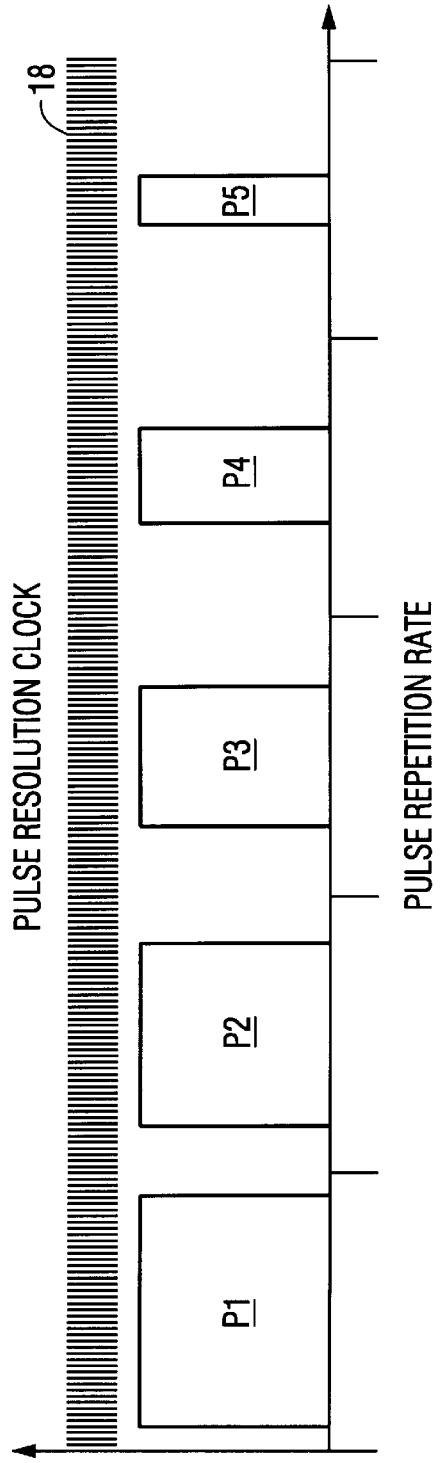
FIG. 2 is a plot of the PWM pulses and the pulse resolution clock signal for the class D amplifier as in the prior art of FIG. 1.
Figure 3:
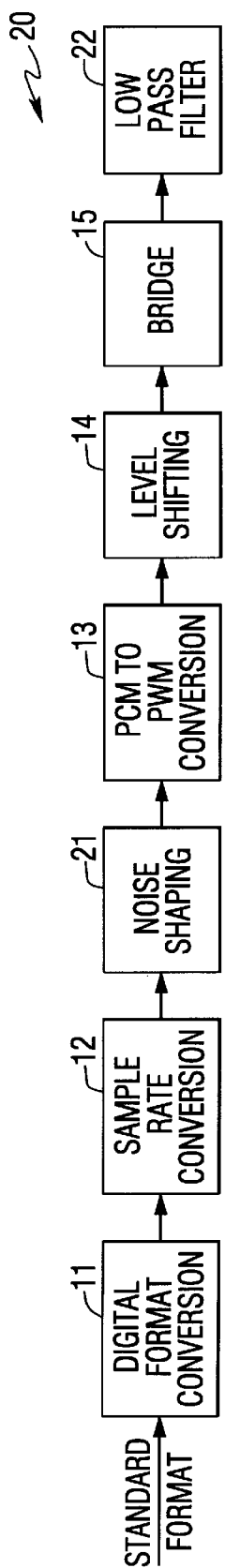
FIG. 3 is a schematic block diagram of a class D amplifier according to the prior art and including a noise shaper.
Figure 4:
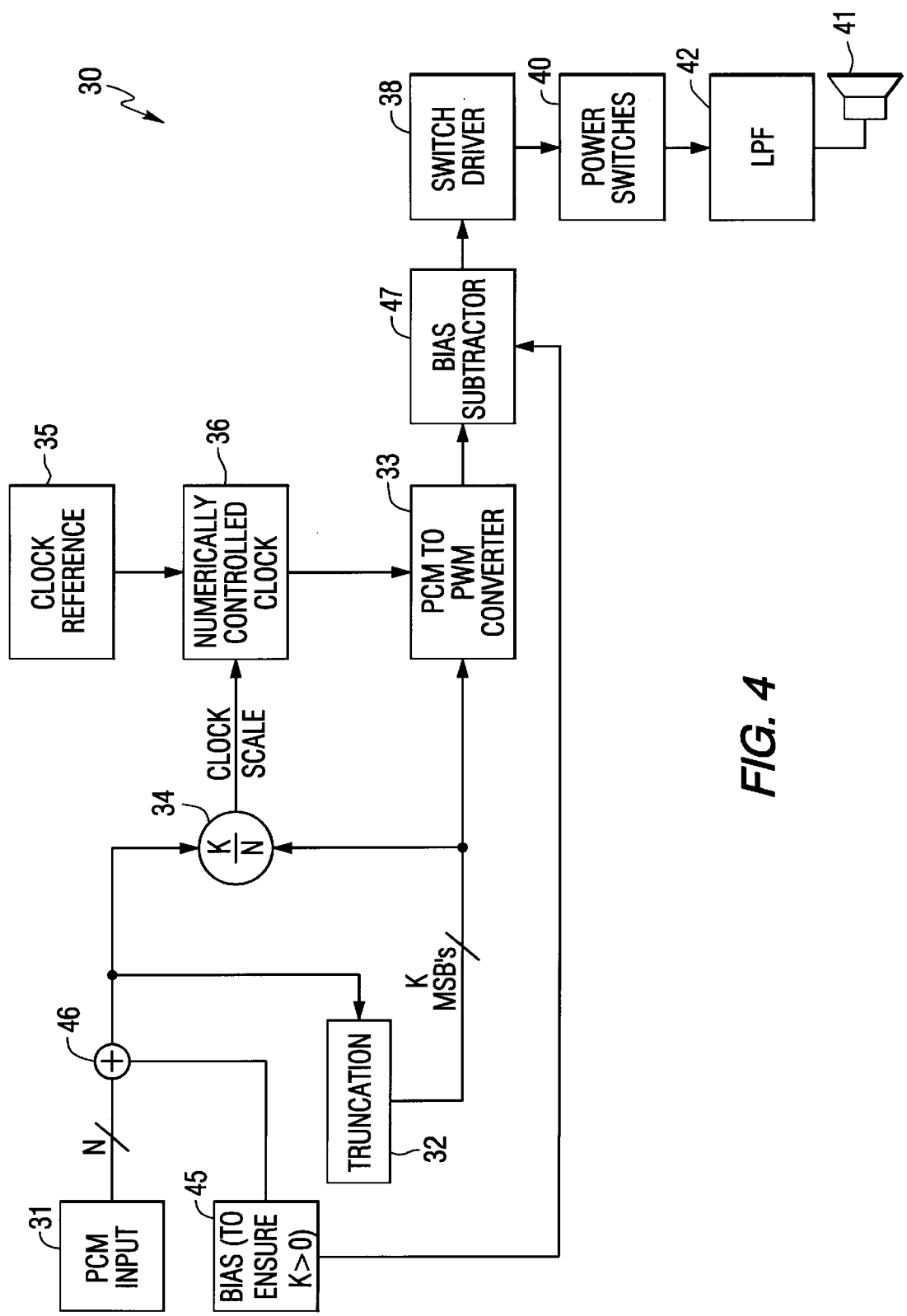
FIG. 4 is a schematic block diagram of a class D amplifier in accordance with the present invention.

The class D amplifier 30 of the present invention is first explained with reference to FIG. 4. The class D amplifier 30 comprises a scaled clock generator for generating a scaled clock signal based upon an N bit pulse code modulation (PCM) signal and a K most significant bits (MSBs) PCM signal from the N bit PCM signal, and a PCM to pulse width modulation (PWM) converter 33 for converting the K MSBs signal to a PWM output signal based upon the scaled clock signal. More particularly, the illustrated class D amplifier 30 preferably includes PCM input means 31 for generating the N bit PCM signal from an input signal. The input means 31 may be provided by a digital format converter 11, and sample rate converter 12 as are conventionally used in other class D converters as shown in FIGS. 1 and 3, for example, and as will be readily appreciated by those skilled in the art.

The amplifier 30 also illustratively includes truncation means 32 for truncating the N bit PCM digital signal to a K MSBs PCM signal. The PWM output signal may be coupled to a switch driver 38 which, in turn, is coupled to one or more output switches 40 as will be readily appreciated by those skilled in the art. The switch driver 38 translates the PWM signal into a format compatible with the power switches 40. The output of the switches 40 may be coupled to a transducer, such as the illustrated speaker 41, via the illustrated low pass filter 42 although those of skill in the art will appreciate other applications for the class D amplifier 30 in accordance with the invention. The amplifier 30 produces a high quality output signal with a practically implemented reference clock, and without the drawbacks associated with a conventional noise shaping filter as will now be described in further detail.

The scaled clock generator or generating means may be provided by the illustrated divider 34 having a first input receiving the N bit digital input signal and a second input receiving the K MSBs signal for generating a clock scale ratio signal. In the illustrated embodiment, the first input of the divider 34 is a denominator input and the second input is a numerator input. The scaled clock generating means may also include the illustrated reference clock 35, and the numerically controlled clock 36. The numerically controlled clock 36 may have a first input connected to the reference clock 35 and a second input connected to receive the clock scale ratio signal from the divider 34. The numerically controlled clock 36, thus produces at the output the scaled clock signal for the PCM to PWM converter 33.

According to another important aspect of the invention, the scaled clock generator of the class D amplifier 30 may further comprise bias means for inputting a bias value to the divider 34 so that a numerator thereof is greater than zero. In other words, there is a minimum allowable pulse width going into the divider 34 dictated by the fact that if the K MSBs are all equal to zero, then the numerically controlled clock 36 would go to an invalid value. In the illustrated embodiment, the bias means is provided by the bias block 45 and adder 46 which adds the bias to the N bit PCM signal upstream of the divider 34. The added bias prevents the K MSBs from all being zero. To remove the added bias, the illustrated class D amplifier 30 may also include the bias subtracting means or subtractor 47 for subtracting the added bias downstream from the PCM to PWM converter 33.

As would be readily understood by those skilled in the art, the PCM to PWM converter 33 may be one of a leading edge, trailing edge, and symmetric PCM to PWM converter. Additionally, the PCM to PWM converter 33 may be a binary or trinary polarity PCM to PWM converter. The lack of a zero representation in the illustrated class D amplifier 30 indicates that the most straightforward implementation includes the use of binary pulse polarity as will be readily appreciated by those skilled in the art. Those of skill in the art will also appreciate other more complex variations to overcome the zero representation limitation.

An example of the class D amplifier 30 in accordance with the present invention will now be explained, and additional reference to FIG. 5 will be helpful in understanding the example. For this example, it is assumed that N is equal to 16, K is equal to 7, and the pulse repetition rate is 352.8 KHz with a 177 ns dead time (1/16 of the pulse repetition period). Thus the maximum pulse duration is 15/16×1/352.8 KHz which is equal to 2.657 µs. The nominal pulse resolution clock frequency is 24.08448 MHZ and the clock period is 41.5 ns. The PCM value input to the amplifier 30 is 0001101010110000 binary.

Figure 5:
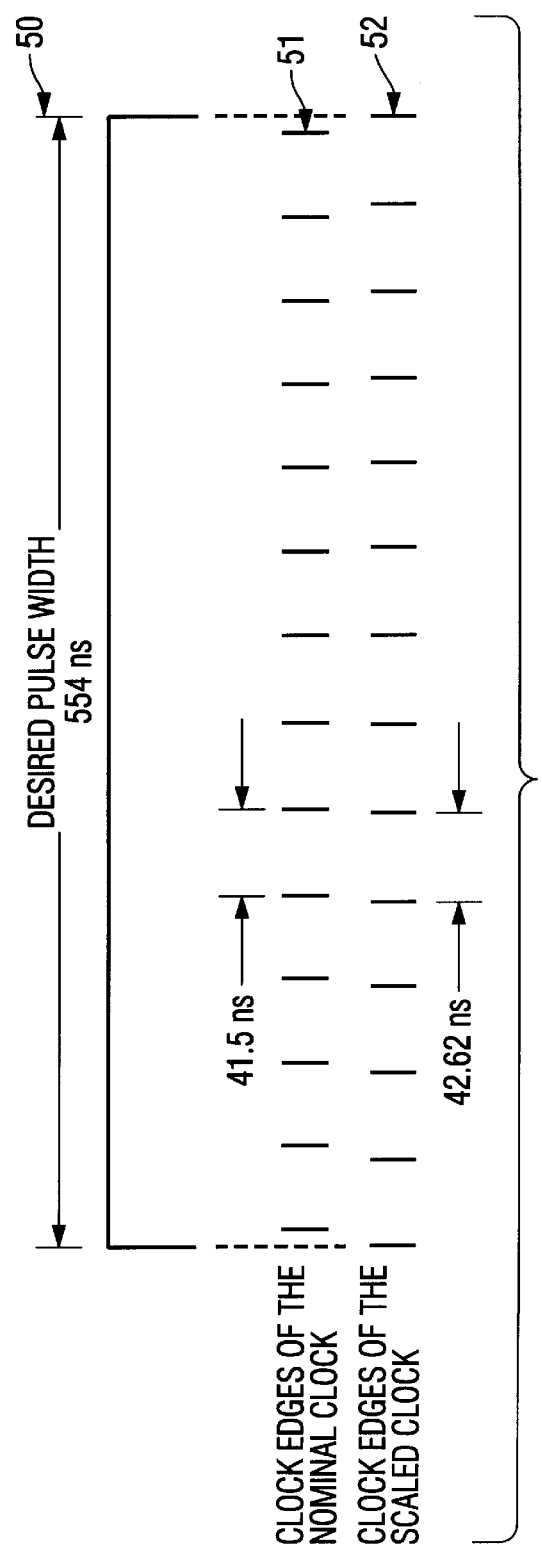
FIG. 5 is a plot of the desired pulse width, clock edges of the nominal clock, and clock edges of the scaled clock in accordance with the example of the present invention.

Assuming a two's complement input and a biased binary output, then a brute force implementation would require a pulse resolution clock frequency of 12.3 GHz and the PCM value would yield a pulse duration of 554 ns as shown by the clock edges in the upper plot 50 of FIG. 5. For ease of explanation, any additional pulse width from the bias value is ignored. For the class D amplifier 30 of the present invention, the clock scale factor would be 0.9742 and the resulting clock is 23.464 MHZ. This clock has a period of 42.62 ns as shown in the lower plot 52 of the clock edges of FIG. 5. The value of the K MSBs going to the PCM to PWM converter 33 is 13. The pulse duration for this example is 13×42.62 ns or 554 ns. The middle plot 51 of FIG. 5 illustrates the clock edges of the nominal clock which has a period of 41.5 ns.

As will be readily appreciated by those skilled in the art, for the class D amplifier 30 in accordance with the present invention the input and output have a deterministic and isomorphic relationship. This is not the case for the prior art class D amplifier 21 (FIG. 3) which has a dithered output, and, therefore, the output is statistically distributed for a given input.

Yet another aspect of the invention relates to a method for performing class D amplification. The method preferably comprises the steps of: generating a scaled clock signal based upon an N bit pulse code modulation (PCM) signal and a K most significant bits (MSBs) PCM signal from the N bit PCM signal; and converting the K MSBs signal to a pulse width modulation (PWM) output signal based upon the scaled clock signal. The step of generating the scaled clock signal may preferably comprise the steps of: dividing the K MSBs signal by the N bit digital input signal for generating a clock scale ratio signal, and controlling a numerically controlled clock 36 by the clock scale ratio signal for producing the scaled clock signal.

The method may also include the steps of: inputting a bias value for the dividing step so that a numerator is greater than zero, and subtracting the bias downstream from the PCM to PWM converting.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A class D amplifier comprising:
   input means for generating an N bit Pulse Code Modulated (PCM) signal from an input signal;
   truncation means for truncating the N bit PCM digital signal to a K most significant bits (MSBs) PCM signal;
   scaled clock generating means for generating a scaled clock signal based upon the N bit PCM signal and the K MSBs PCM signal;
   a pulse code modulation (PCM) to pulse width modulation (PWM) converter for converting the K MSBs signal to a PWM output signal based upon the scaled clock signal.

2. A class D amplifier according to claim 1 wherein said scaled clock generating means comprises a divider having a first input receiving the N bit digital input signal and a second input receiving the K MSBs signal for generating a clock scale ratio signal.

3. A class D amplifier according to claim 2 wherein the first input of said divider is a denominator input and the second input of said divider is a numerator input.

4. A class D amplifier according to claim 2 wherein said scaled clock generating means further comprises:
   a reference clock; and
   a numerically controlled clock having a first input connected to said reference clock and a second input connected to receive the clock scale ratio signal for producing the scaled clock signal.

5. A class D amplifier according to claim 2 further comprising bias means for inputting a bias value to said divider so that a numerator thereof is greater than zero.

6. A class D amplifier according to claim 5 further bias subtracting means for subtracting the bias downstream from said PCM to PWM converter.

7. A class D amplifier according to claim 1 wherein said PCM to PWM converter comprises one of a leading edge, trailing edge, and symmetric PCM to PWM converter.

8. A class D amplifier according to claim 1 wherein said PCM to PWM converter comprises one of a binary or trinary polarity PCM to PWM converter.

9. A class D amplifier according to claim 1 further comprising a switch driver connected to the PWM output signal of said PCM to PWM converter.

10. A class D amplifier according to claim 9 further comprising at least one power switch connected to said switch driver.

11. A class D amplifier comprising:
   input means for generating an N bit Pulse Code Modulated (PCM) signal from an input signal;
   truncation means for truncating the N bit PCM signal to a K most significant bits (MSBs) PCM signal;
   a divider having a first input receiving the N bit input signal and a second input receiving the K MSBs signal for generating a clock scale ratio signal;
   a reference clock;
   a numerically controlled clock having a first input connected to said reference clock and a second input connected to receive the clock scale ratio signal for producing a scaled clock signal therefrom; and
   a pulse code modulation (PCM) to pulse width modulation (PWM) converter for converting the K MSBs signal to a PWM output signal based upon the scaled clock signal.

12. A class D amplifier according to claim 11 wherein the first input of said divider is a denominator input and the second input of said divider is a numerator input.

13. A class D amplifier according to claim 11 further comprising bias means for inputting a bias value to said divider so that a numerator thereof is greater than zero.

14. A class D amplifier according to claim 13 further bias subtracting means for subtracting the bias downstream from said PCM to PWM converter.

15. A class D amplifier according to claim 11 wherein said PCM to PWM converter comprises one of a leading edge, trailing edge, and symmetric PCM to PWM converter.

16. A class D amplifier according to claim 11 wherein said PCM to PWM converter comprises one of a binary or trinary polarity PCM to PWM converter.

17. A class D amplifier according to claim 11 further comprising a switch driver connected to the PWM output signal of said PCM to PWM converter.

18. A class D amplifier according to claim 17 further comprising at least one power switch connected to said switch driver.

19. A class D amplifier comprising:
 a scaled clock generator for generating a scaled clock signal based upon an N bit pulse code modulation (PCM) signal and a K most significant bits (MSBs) PCM signal from the N bit PCM signal;
 a PCM to pulse width modulation (PWM) converter for converting the K MSBs signal to a PWM output signal based upon the scaled clock signal; and
 a switch driver connected to the PWM output signal of said PCM to PWM converter.

20. A class D amplifier according to claim 19 wherein said scaled clock generating means comprises a divider having a first input receiving the N bit digital input signal and a second input receiving the K MSBs signal for generating a clock scale ratio signal.

21. A class D amplifier according to claim 20 wherein the first input of said divider is a denominator input and the second input of said divider is a numerator input.

22. A class D amplifier according to claim 20 wherein said scaled clock generating means further comprises:
 a reference clock; and
 a numerically controlled clock having a first input connected to said reference clock and a second input connected to receive the clock scale ratio signal for producing the scaled clock signal.

23. A class D amplifier according to claim 20 further comprising bias means for inputting a bias value to said divider so that a numerator thereof is greater than zero.

24. A class D amplifier according to claim 23 further bias subtracting means for subtracting the bias downstream from said PCM to PWM converter.

25. A class D amplifier according to claim 19 wherein said PCM to PWM converter comprises one of a leading edge, trailing edge, and symmetric PCM to PWM converter.

26. A class D amplifier according to claim 19 wherein said PCM to PWM converter comprises one of a binary or trinary polarity PCM to PWM converter.

27. A class D amplifier according to claim 19 further comprising at least one power switch connected to said switch driver.

28. A method of performing class D amplification comprising the steps of:
 generating a scaled clock signal based upon an N bit pulse code modulation (PCM) signal and a K most significant bits (MSBs) PCM signal from the N bit PCM signal, the step of generating the scaled clock signal comprising dividing the K MSBs signal by the N bit digital input signal for generating a clock scale ratio signal; and
 converting the K MSBs signal to a pulse width modulation (PWM) output signal based upon the scaled clock signal.

29. A method according to claim 28 wherein the step of generating the scaled clock signal further comprises the step of controlling a numerically controlled clock by the clock scale ratio signal for producing the scaled clock signal.

30. A method according to claim 28 further comprising the step of inputting a bias value for the dividing step so that a numerator is greater than zero.

31. A method according to claim 30 further comprising the step of subtracting the bias downstream from the PCM to PWM converting.

32. A method according to claim 28 wherein the step of converting comprises converting by one of leading edge, trailing edge, and symmetric PCM to PWM converting.

33. A method according to claim 28 wherein the step of converting comprises converting by one of a binary or trinary polarity PCM to PWM converting.

34. A method according to claim 28 further comprising the step of operating at least one power switch based upon the PWM output signal.

* * * * *